United States Patent
Cabral, Jr. et al.

(10) Patent No.: US 6,921,711 B2
(45) Date of Patent: Jul. 26, 2005

(54) METHOD FOR FORMING METAL REPLACEMENT GATE OF HIGH PERFORMANCE

(75) Inventors: Cyril Cabral, Jr., Ossining, NY (US); Paul C. Jamison, Hopewell Junction, NY (US); Victor Ku, Yorktown Heights, NY (US); Ying Li, Poughkeepsie, NY (US); Vijay Narayanan, New York, NY (US); An L Steegen, Stamford, CT (US); Yun-Yu Wang, Poughquag, NY (US); Kwong H. Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,106

(22) Filed: Sep. 9, 2003

(65) Prior Publication Data

US 2005/0051854 A1 Mar. 10, 2005

(51) Int. Cl.$^7$ .............................................. H01L 21/443
(52) U.S. Cl. ..................... 438/589; 438/592; 438/595
(58) Field of Search ................... 438/259, 270, 438/589, 592, 595, 926; 257/412, 751, 753

(56) References Cited

U.S. PATENT DOCUMENTS

| | | | | |
|---|---|---|---|---|
| 5,430,320 A | * | 7/1995 | Lee ............................. | 257/412 |
| 5,789,312 A | * | 8/1998 | Buchanan et al. .......... | 438/585 |
| 6,033,963 A | | 3/2000 | Huang et al. | |
| 6,271,106 B1 | * | 8/2001 | Grivna et al. ............... | 438/570 |
| 6,303,447 B1 | | 10/2001 | Chhagan et al. | |
| 6,387,765 B2 | | 5/2002 | Chhagan et al. | |
| 6,410,376 B1 | * | 6/2002 | Ng et al. ..................... | 438/199 |
| 6,528,362 B1 | | 3/2003 | Besser et al. | |
| 6,794,281 B2 | * | 9/2004 | Madhukar et al. .......... | 438/592 |
| 2001/0027005 A1 | * | 10/2001 | Moriwaki et al. .......... | 438/592 |
| 2001/0038136 A1 | * | 11/2001 | Abiko ......................... | 257/412 |
| 2002/0058374 A1 | * | 5/2002 | Kim et al. ................... | 438/228 |
| 2002/0142531 A1 | * | 10/2002 | Hsu et al. .................... | 438/183 |
| 2003/0232497 A1 | * | 12/2003 | Xi et al. ...................... | 438/627 |
| 2004/0175910 A1 | * | 9/2004 | Pan et al. .................... | 438/592 |

* cited by examiner

Primary Examiner—Stephen W. Smoot
(74) Attorney, Agent, or Firm—Mark R. Bilak; Daryl K. Neff

(57) ABSTRACT

A structure and method for a metal replacement gate of a high performance device is provided. A sacrificial gate structure is first formed on an etch stop layer provided on a semiconductor substrate. A pair of spacers is provided on sidewalls of the sacrificial gate structure. The sacrificial gate structure is then removed, forming an opening. Subsequently, a metal gate including an first layer of metal such as tungsten, a diffusion barrier such as titanium nitride, and a second layer of metal such as tungsten is formed in the opening between the spacers.

25 Claims, 5 Drawing Sheets

METHOD FOR FORMING METAL REPLACEMENT GATE OF HIGH PERFORMANCE

BACKGROUND OF INVENTION

The invention relates to a semiconductor structure and processing method, and more particularly to an improved structure and method for a metal gate structure of a high performance device.

In the semiconductor fabrication industry, transistors have typically been formed utilizing polysilicon gate electrodes. Polysilicon has been preferred because of its thermal robustness and other special characteristics. An important feature of polysilicon gates is that they can withstand the processing of other elements of transistors such as source and drain regions, during dopant drive-in or other high temperature processes such as annealing processes.

However, as used in transistors, polysilicon gates are less advantages than metal gates. A polysilicon gate is subject to the formation of a depletion region in operation in which charge carriers are depleted from the polysilicon material above the gate dielectric. This varies from a metal electrode in which charge carriers remain plentiful throughout the electrode. The depletion region has the effect of making the gate dielectric appear thicker in operation than it actually is, such that more charge is needed to turn on the transistor having the polysilicon gate than the transistor having the metal gate. Another disadvantage of polysilicon gates is its incompatibility with high-k dielectric materials. Moreover, polysilicon, even when highly doped to dopant concentrations up to $10^{20} cm^{-3}$, is not nearly as good a conductor as metal. This causes polysilicon gates to operate at a slower speed than metal gates. For these reasons, as design requirements demand better performance, metal gates are favored.

The alternative to using polysilicon gates is fabrication and use of metal gates instead. Metals are much better conductors of electricity, resulting in reduced gate contact resistance, which provides faster device performance. Manufacturing of metal gates, however, can pose serious challenges. For one, metal gates are not thermally robust like polysilicon and therefore cannot be exposed to high temperatures during processing of transistors or other elements of integrated circuits (ICs). Furthermore, metal gates cannot withstand the oxidation ambient necessary to form polysilicon transistor gates. In addition, patterning accuracy required in gate formation is reduced when performing photolithography or other similar techniques on metal surfaces. The reason for this is that photolithography is better achieved on planar surfaces not easily obtainable in metals.

In recent years, there has been an effort to overcome the limitations of metal gate processing and the operational deficiencies of polysilicon gates through a process of forming transistor structures initially having polysilicon gates which are better able to withstand the initially more severe processing conditions. Thereafter, in later stages of processing when processing conditions are less severe, the polysilicon gates are removed from the structures and replaced with metal gates. By this replacement gate process, the initial severe process conditions need not be modified, and the photolithography benefits associated with polysilicon processing are preserved. The initial use of polysilicon gates also takes advantage of the ability of polysilicon to block ion-implantation to the channel region of the transistor when performing source and drain implants to the transistor.

In a replacement gate fabrication approach, a polysilicon gate is formed over an etch stop layer in contact with a single-crystal semiconductor region of a substrate, a pair of spacers being disposed on sidewalls of the gate. The etch stop layer is typically a thin layer of silicon dioxide which is grown thermally on the surface of the substrate in an oxygen ambient. In such case, the etch stop layer can be referred to as a sacrificial gate oxide layer. Later, the polysilicon material is removed from between the pair of spacers, as by an anisotropic vertical etch process such as a reactive ion etch (RIE) stopping on the etch stop layer. The etch stop layer is then cleared from the surface of the substrate as by a dry etch or an isotropic wet etch selective to the material of the sidewall spacers. This creates an opening between the spacers where a gate dielectric, usually a thermally grown oxide, is then formed. Thereafter, a metal gate is formed in the opening between the spacers contacting the gate dielectric underneath.

A preferred metal for forming such metal gates is tungsten (W). Tungsten is usually deposited using a chemical vapor deposition step (CVD) where a deposition precursor including a (source) gas such as $WF_6$ is used. A particular challenge arises in the deposition of tungsten, however, especially when using $WF_6$ as the deposition precursor. Fluorine radicals in the $WF_6$ gas can be harmful both to oxide and silicon substances. Consequently, the fluorine gas can attack gate oxide and the silicon below the gate oxide. A different gas such as $W(CO)_6$ may alternatively be used but the non-conformal properties of $W(CO)_6$ can cause the formation of a defective tungsten gate. FIG. 1 illustrates the non-conformal tungsten properties of deposition using a $W(CO)_6$ gas, leading to the pinch-off of the opening and a defective tungsten gate formation.

In FIG. 1, $W(CO)_6$ 110 has been deposited to coat the gate opening 100. The spacers are shown at 105. As illustrated in 115, the non-conformal characteristics of $W(CO)_6$, especially when deposited in thick layers of 10 nm or more, create a pinchoff at the top of the gate opening 100 is filled. In addition, the non-conformal property of such deposition causes tungsten to accumulate unevenly so that a void is created in the middle or center of the tungsten gate, rendering the gate structurally defective. The pinchoff problem is extremely challenging in high performance environments where the width of the opening is narrow.

Another challenge, when using either $WF_6$ or $W(CO)_6$ gases, is that effective deposition of tungsten requires a good nucleation site to be present on the surfaces (i.e. sidewalls) where it is being deposited. The presence of oxides, especially on surfaces, affect the ability of tungsten to be deposited and to adhere properly to the surfaces it is being deposited on. Ineffective deposition of tungsten can lead to structurally defective gates in which the gate conductor material may peel or pop off from their adjacent surfaces.

An improved method is therefore required that enables the formation of metal gates, particularly those including tungsten as the predominant metal that addresses the processing challenges faced in the above-described processing methods.

SUMMARY OF INVENTION

A structure and method for a metal replacement gate of a high performance device is provided. According to an aspect of the invention, a method is provided of fabricating a metal gate structure of an integrated circuit in an opening within a dielectric region formerly occupied by a sacrificial gate, wherein the metal gate includes a first layer consisting essentially of a material selected from metals and compounds of metals contacting a gate dielectric, the gate dielectric contacting a transistor channel region formed in a semiconductor region of a substrate; a diffusion barrier layer overlying the first layer; and a second layer consisting essentially of at least one material selected from the group consisting of metals and compounds of metals overlying the diffusion barrier layer.

According to another aspect of the invention, a method is provided for making a metal gate structure on a substrate comprising: forming an etch stop layer on a semiconductor region of a substrate; forming a sacrificial gate contacting said etch stop layer; providing a pair of dielectric spacers on sidewalls of the sacrificial gate; forming a dielectric layer on the substrate having a top surface generally planar to a top of the sacrificial gate; removing the sacrificial gate to form an opening between the spacers; removing the etch stop layer from under the opening; forming a gate dielectric on the semiconductor region under the opening; depositing a first layer of metal in the opening contacting the gate dielectric and sidewalls of the spacers; forming a diffusion barrier layer on the first layer of metal in the opening; and depositing a second layer of metal on the diffusion barrier layer in the opening.

According to a preferred aspect of the invention, chemical mechanical polishing is used to remove deposited metal overlying the dielectric layer outside of the opening.

According to yet another aspect of the invention, an integrated circuit is provided including a transistor having a gate wherein the gate includes a first layer consisting essentially of at least one material selected from the group consisting of metals and compounds of metals, said first layer contacting a gate dielectric formed on a semiconductor region of a substrate; a diffusion barrier overlying the first layer of metal; and a second layer consisting essentially of at least one material selected from the group consisting of metals and compounds of metals, of metal overlying the diffusion barrier, the first and second layers of metal and the diffusion barrier layer being disposed within an opening between a pair of dielectric spacers.

DETAILED DESCRIPTION

Figure 1:
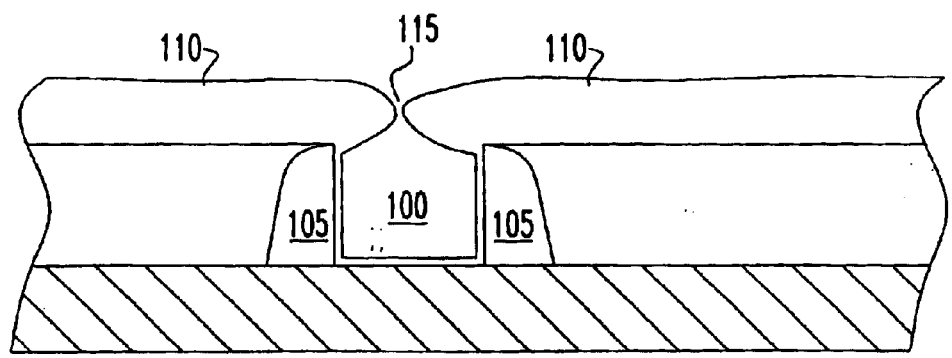
FIG. 1 is an illustration of a potential pinchoff problem caused by deposition of a thick layer of tungsten in an opening.

The present invention particularly addresses and solves problems related to the formation of metal gates in transistors. In an embodiment of the invention, the metal can be selected for workfunction compatibility with the conductivity type of transistor in which it is used. For example, in an NFET, a metal gate having a workfunction equivalent to that of n-type conductivity semiconductor material performs better than a metal having a mid-range workfunction or a workfunction equivalent to that of p-type semiconductor material. In an embodiment of the invention, a structure and method are provided by which a metal having a desirable workfunction can be formed in contact with the gate dielectric in an integrated structure and method that decouples the particular choice of metal used in that step from later processing.

In an embodiment described herein, the particular metal formed in contact with the gate can be selected for its compatibility with the gate dielectric material. For example, the gate dielectric can include a material specially selected for its high dielectric constant K such as hafnium oxide ($HfO_2$) or zirconium oxide ($ZrO_2$). The gate can then include a metal in contact with the gate dielectric that has superior compatibility, such as hafnium (Hf) or zirconium (Zr).

In another embodiment of the invention, a first layer of metal is formed in contact with the gate dielectric. Such layer is desirably selected for its properties in terms of workfunction, compatibility with the gate dielectric, or characteristics of the process in depositing the metal on the gate dielectric. A diffusion barrier layer is then formed over the first layer of metal. Thereafter, a second layer of metal is formed over the diffusion barrier layer. Because of the presence of the diffusion barrier layer, a greater choice is available over the metal used in the second layer of metal. Thus, for example, that metal can be selected for the characteristics of the deposition process used to form the second layer.

A structure and process is provided for forming metal gates having tungsten (W) as a preferred material of a first layer in contact with the gate dielectric. Tungsten (W) is a particularly versatile material for metal gates because it has a workfunction at about the middle of the difference between the workfunctions of n-type and p-type semiconductor materials. Because of that, tungsten can be used in metal gates of n-type field effect transistors (NFETs) in which electrons are the dominant charge carriers and also p-type field effect transistors (PFETs) in which holes are the dominant charge carrier. Moreover, unlike some other metals which can only be deposited by physical vapor deposition (PVD), e.g. sputtering, tungsten can be deposited using a chemical vapor deposition (CVD) process.

In a particular embodiment, problems of forming metal gates in openings having a large ratio of height to width, i.e. openings having "high aspect ratio", are addressed. The embodiment of the present invention allows particular deposition processes to be selected for their particular advantages, despite other problems that are associated with those processes. For example, a relatively thin layer of metal can be formed as a first layer of metal by a deposition process that is compatible with the gate dielectric. However, that deposition process can be problematic if attempts are made to use it to form the entire gate. As described above, deposition of tungsten from a carbonyl of tungsten (W(CO)$_6$) is such a deposition process that is compatible with oxide gate dielectrics such as silicon dioxide, but with which filling problems including pinch-off and voids have been observed in high aspect ratio openings.

Figure 2A:
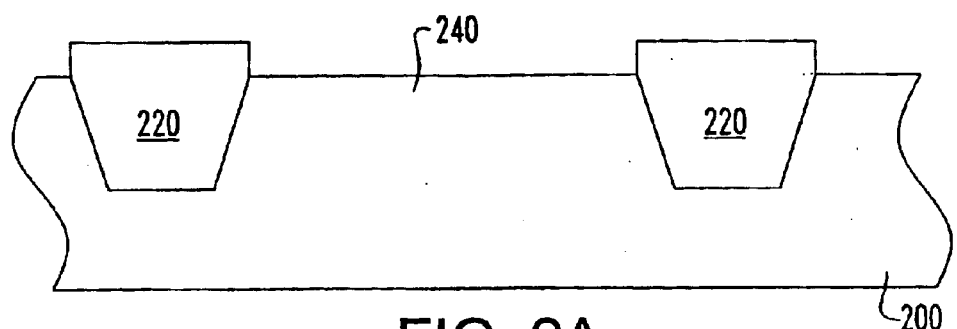
FIGS. 2A through 5 illustrate subsequent processing steps in the formation of a sacrificial gate structure as per one embodiment of the present invention.

FIG. 2A illustrates a semiconductor substrate 200. The term "substrate" is used herein for ease of reference and includes a variety of types of substrates including bulk semiconductor substrates, semiconductor-on-insulator substrates such as a "silicon-on-insulator" (SOI) substrates, germanium (Ge) substrates and silicon germanium (SiGe) substrates. Such substrates include a region of a single-crystal semiconductor at a main surface thereof. The term substrate may also be applied to a substrate having a thin deposited semiconductor layer when the process described herein is used to form a thin film transistor (TFT).

Isolation structures as shown at 220 are then formed on the substrate 200. In the embodiment illustrated in FIG. 2A, the isolation structures 220 are raised, however, there is no need for these structures to be raised and other embodiments can be achieved where the structures are planarized with the substrate. Furthermore, the isolation structures 220 can include a variety of structures such as shallow trench isolation and are formed selectively on the substrate 200.

The area of the substrate defined by and in between the isolation structures 220 is known as the active area and is shown in FIG. 2 at 240. The active area 240 will house the active electrical devices. The purpose of the isolation structures is to provide electrical isolation between devices in various and particularly adjacent active areas 240.

Figure 2B:
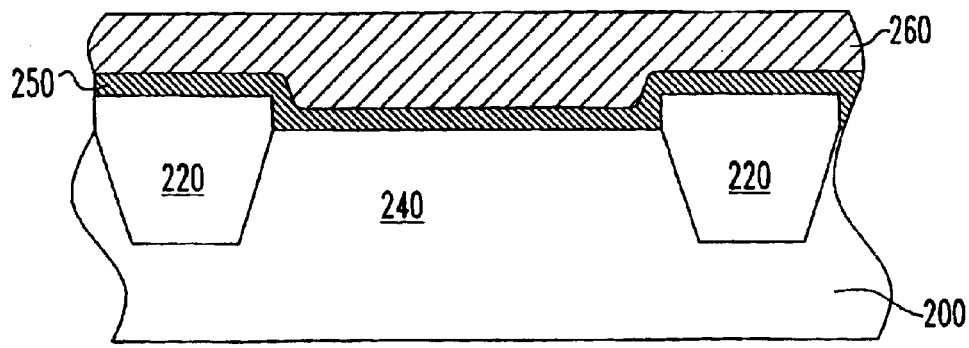
Figure 3:
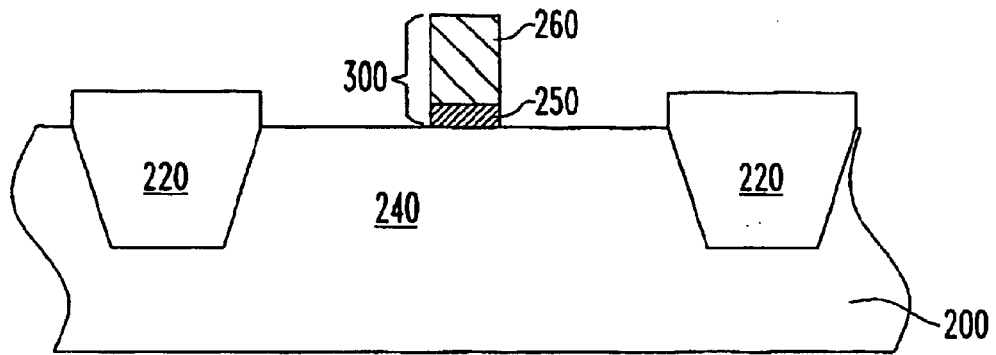

FIG. 2B illustrates a next processing stage where initial process steps are taken to form a sacrificial polysilicon gate on the substrate 200. As shown in FIG. 2B, an etch stop layer 250 is formed by deposition or grown on the substrate 200. In a preferred embodiment of the present invention as illustrated in FIG. 2B, the etch stop layer 250 includes a layer of oxide such as silicon dioxide when the substrate 200 consists essentially of silicon. In such case, the etch stop layer 250 can be referred to as a sacrificial gate oxide layer or a sacrificial oxide layer. Alternatively, a nitride such as silicon nitride, silicon oxynitride or another material can be used for the etch stop layer 250. The etch stop layer 250 is preferably an oxide layer. As shown in FIG. 2B, a layer 260 of polysilicon is then deposited as a sacrificial gate material on the etch stop layer 250. As shown in FIG. 3, the sacrificial gate material 260 and etch stop layer 250 are then patterned together. Since the sacrificial gate is formed of polysilicon as is widely used in NFET and PFET transistors, patterning processes are readily available.

In the embodiment provided in FIG. 3, photolithography is used to pattern a gate stack structure 300 including an etch stop layer provided as an oxide layer 250 and the polysilicon layer thereon 260. The photolithography procedure is then followed by an anisotropic etch process such as reactive ion etch (RIE) but other methods could be used instead.

Figure 4:
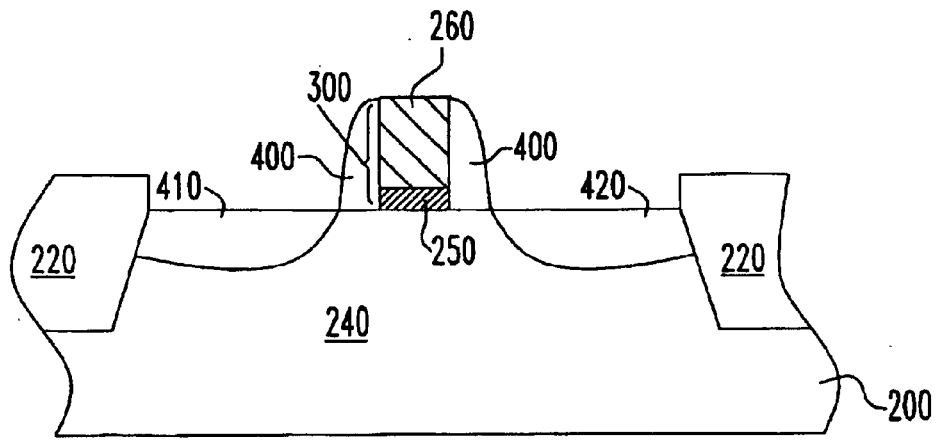

In the next processing step, spacers are formed on the sidewalls of the gate stack structure 300 as shown in FIG. 4. In an embodiment, the spacers 400 are formed by deposition of a conformal spacer material followed by an anisotropic vertical etch such as RIE such that the only the vertically-oriented spacers remain thereafter, as adhering to sidewalls of the sacrificial gate 300. The material of which spacers 400 are formed can include one or more materials from a variety of available materials selected for integration in the particular process steps that are used. For example, when the etch stop layer 250 includes an oxide, the spacers 400 are preferably formed of a non-oxide material such as silicon nitride or other nitride such that a later process step in which the etch stop is removed by isotropic wet etching, etch selectivity is provided between the non-oxide spacers and the oxide etch stop layer 250. Alternatively, when the etch stop layer 250 is formed of a nitride such as silicon nitride, the spacers 400 are desirably formed of a non-nitride material to provide etch selectivity between the non-nitride spacers and the nitride etch stop layer 250. When the etch stop layer 250 is formed of silicon oxynitride, spacers 400 can be formed of either oxide or nitride as an isotropic wet etch chemistry having etch selectivity to either oxide or nitride.

In addition, FIG. 4 illustrates a process of forming the source and drain regions as shown at 410 and 420. Since a sacrificial gate having a polysilicon layer 240 is used, the substrate 200 can also be doped to form the source and drain regions 410 and 420 in the active area 240. The doping involves the implantation of ions into the substrate to alter the conductivity of the source and drain regions 410 and 420. Polysilicon, as mentioned above, has the ability to block such implantation to the channel region.

The regions shown at 410 and 420 in FIG. 4 can also be implanted to form lightly doped source/drain extension regions and/or halo implanted. In addition, either or both N-type and P-type impurities can be implanted as required in order to form the specific desired components. For example, if circuits are to be implemented in a complementary metal oxide semiconductor (CMOS) technology, N-type and P-type dopants must be implanted into respective portions of the substrate to form the source and drain regions of the p-type or n-type transistors in that technology. Polysilicon has an ability to block the ion implantation of doped atoms, therefore, the sacrificial polysilicon gate 300 and the spacers 400 together function as an implant mask.

The use of a sacrificial polysilicon gate in these early stages of processing a metal gate allows high temperature processing to be performed. For example, a high temperature dopant drive-in process is generally required following implanting a dopant into source and drain regions of the substrate after patterning the gate.

Figure 5:
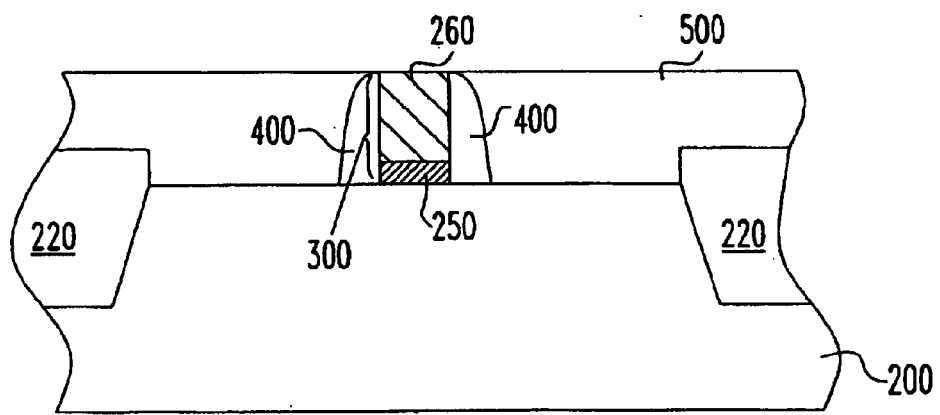

Next, as shown in FIG. 5, an interlevel dielectric 500 layer is blanket deposited over the substrate 200. In an embodiment, the interlevel dielectric 500 is then planarized, stopping at the sacrificial gate stack 300. A variety of processes are available for planarization such as chemical mechanical polishing.

Figure 6A:
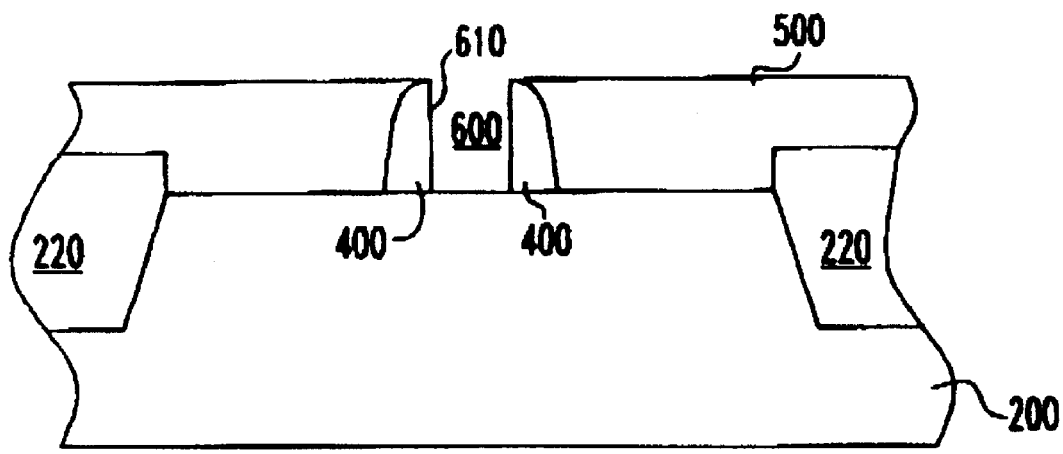
FIG. 6A is a cross sectional view of a substrate with spacers formed on its surface subsequent to the removal of a sacrificial gate structure.

In FIG. 6A, the sacrificial gate 260 is removed, as by RIE, stopping on the etch stop layer 250 so as to avoid damaging the surface of the substrate 200 below. Thereafter, the etch stop layer 250 is preferably removed, leaving the surface of the substrate 200 exposed in an opening 600 between the spacers 400, as shown in FIG. 6A. The opening 600 is bound by the top of the substrate 200 and the sidewalls 610 of the spacers 400.

In an alternative embodiment, when the etch stop layer 250 is formed of a material and thickness suitable to perform as a gate dielectric, the polysilicon gate 260 can be removed only and the etch stop layer 250 then left in place as the final gate dielectric. Doing so simplifies processing, as a step of removing the etch stop layer 250 and forming a new gate dielectric 650 are avoided.

However, because of the possibility of damage to the etch stop layer 250 during the removal of the sacrificial polysilicon gate 260, especially when the sacrificial gate is removed by RIE, the entire etch stop layer 250 is preferably removed, and the final gate dielectric be formed thereafter on the surface of the substrate 200. Post etch cleaning is then preferably conducted following the removal of the etch stop layer 250.

An advantage of removing the etch stop layer 250 and forming a new layer for use as a gate dielectric 650 is that conditions during formation of the new layer 650 can be optimized for the purpose of providing the final gate dielectric. Thus, in such embodiment, the material and thickness of the final gate dielectric can be more finely controlled.

Figure 6B:
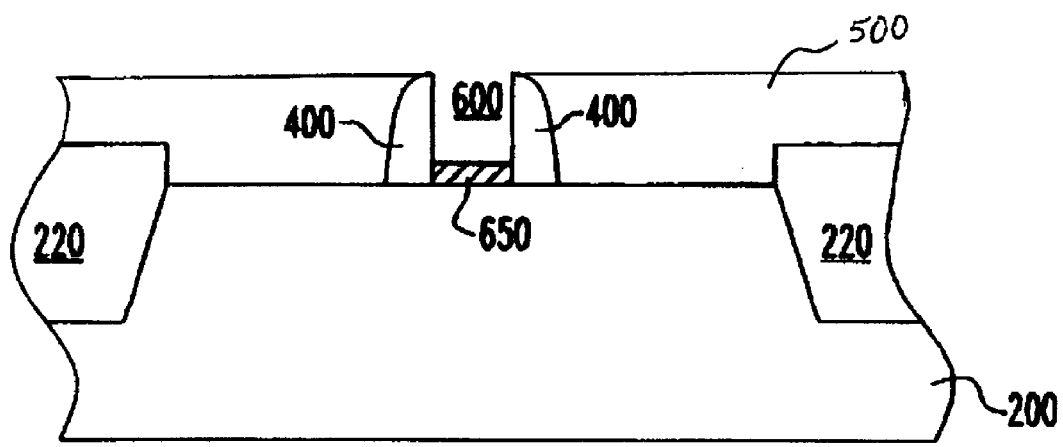
FIG. 6B illustrates an alternate embodiment of the present invention where a new layer of gate oxide is deposited after the removal of sacrificial gate structure.

In an embodiment in which the etch stop layer 250 is removed, a new gate dielectric 650 is formed on the surface of the substrate 200, as shown in FIG. 6B. In a preferred embodiment, a gate dielectric 650 having an oxide layer, or alternatively, a nitride layer, is thermally grown on the substrate 200 within the opening 600. In another embodiment, the gate dielectric 650 is formed by deposition, as by low pressure chemical vapor deposition (LPCVD). Other choices of materials exist for the gate dielectric. For example, a gate dielectric of hafnium oxide ($HfO_2$) or of zirconium oxide ($ZrO_2$) can be formed as a gate dielectric having a desirably high dielectric constant K, higher than that of either silicon dioxide, silicon nitride or silicon oxynitride. Such high-k gate dielectric may be advantageous for a particular application, such as where a thicker gate dielectric is needed to protect against dielectric breakdown but without sacrificing transistor switching performance.

Figure 7:
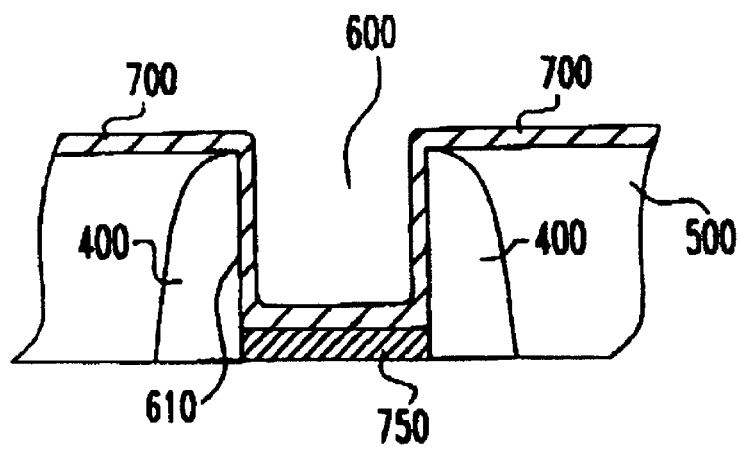
FIGS. 7 through 10 are subsequent steps in the formation of a metal gate structure as per one embodiment of the present invention.

Once the final gate dielectric 650 has been formed, the final gate can then be formed. FIG. 7 illustrates a stage in forming the final gate including a metal or conductive metal compound. In the exemplary embodiment illustrated in FIGS. 7 to 10, tungsten is used as a preferred material of a first layer 700 in contact with the gate dielectric 650. A range of choices exist for metals and metal compounds which can be deposited onto the gate dielectric 650 as a first metal layer 700 of the gate. Such choices include but are not limited to: iridium (Ir), niobium (Nb), platinum (Pt), rhenium (Re), rhodium (Rh), ruthenium (Ru), tantalum (Ta), tantalum nitride (TaN), tantalum silicon nitride (TaSiN), tungsten (W), and vanadium (V).

In addition, when the gate dielectric is formed of a particular material, for example, a high-K dielectric material such as hafnium oxide (HfO) or zirconium oxide (ZrO), the metal of the first layer 700 can be selected for its particular compatibility with the gate dielectric 650. For example, a first metal layer 700 of hafnium (Hf) can be formed in contact with a gate dielectric 650 of hafnium oxide ($HfO_2$). Similarly, a first metal layer 700 of zirconium (Zr) can be formed in contact with a gate dielectric 650 of zirconium oxide ($ZrO_2$).

For many of these metals and metal compounds, only physical vapor deposition processes, e.g. sputtering, exist at the present time. However, chemical vapor deposition processes do exist for depositing tungsten. Therefore, tungsten is a preferred material for use in forming a metal gate. Moreover, tungsten has a workfunction that lies in a middle range between the workfunctions of n-type and p-type semiconductor material. As a result, tungsten can be advantageously used in metal gates of both PFETs and NFETs.

A preferred embodiment for forming a metal gate will now be described in which the first layer 700 of metal is a layer of tungsten. As shown in FIG. 7, a thin layer of tungsten (W) shown at 700 is deposited in the opening 600 in contact with the gate dielectric 650. For ease of reference, the gate dielectric will be referenced with the number 750 irrespective of whether it is a newly formed gate dielectric 650 or is reused as an appropriate dielectric layer after its earlier use as an etch stop layer 250.

The first metal layer 700 of tungsten is deposited preferably by a chemical vapor deposition (CVD) technique using a carbonyl of tungsten, preferably $W(CO)_6$, as a precursor gas. The layer of tungsten shown at 700 is kept thin for best results. In a preferred embodiment of the present invention, the thickness of the tungsten layer 700 is deposited to a thickness in the range of 2 to 20 nm and preferably 2 to 10 nm thick. The layer of tungsten 700 is a layer covering the substrate and at least part of the spacer sidewall 610. In an embodiment of the present invention as shown in FIG. 7, the tungsten layer is deposited to coat the entire sidewall(s) of the spacers 610 in the opening 600 and overlying the oxide layer 750.

Figure 8:
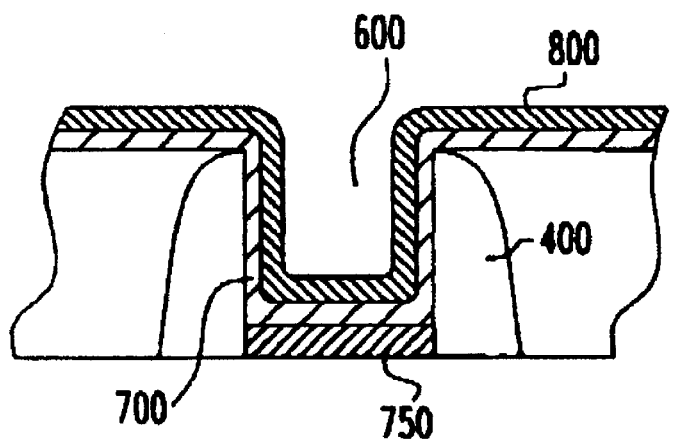

FIG. 8 illustrates a subsequent processing stage in the formation of the metal gate. In FIG. 8, a diffusion barrier layer is deposited in the opening 600 to coat the thin layer of tungsten 700. The diffusion barrier layer can include one or more materials such as titanium nitride (TiN), hafnium nitride (HfN) and zirconium nitride (ZrN). Each of these compounds can be used as a diffusion barrier layer with a variety of different metals formed as a first metal layer 700 in contact with the gate dielectric 650. Diffusion barrier layers including hafnium nitride or zirconium nitride are most preferably used when the first metal layer includes hafnium or zirconium, respectively. In the preferred embodiment described as follows, the diffusion barrier layer 800 includes titanium nitride and will be referred to as a titanium nitride layer 800 or TiN layer 800.

In a preferred embodiment in which the first layer of metal 700 is formed of tungsten, the diffusion barrier layer preferably includes a thin layer of titanium deposited in contact with the tungsten, followed by a layer of titanium nitride (TiN), as shown at 800. This thin layer of titanium is referenced to also as adhesion material or adhesion layer. A variety of processes may be employed to form the diffusion barrier layer 800. In a preferred embodiment, chemical vapor deposition (CVD) is used. Alternatively, the diffusion barrier layer 800 can be deposited using atomic layer deposition (ALD) and physical vapor deposition (PVD) techniques.

The formation of the diffusion barrier layer 800 by deposition of titanium nitride is preferably followed by annealing to improve the properties of the diffusion barrier layer. Annealing is performed to density the deposited titanium nitride layer 800. It is preferable to conduct the annealing process at lower temperatures so as not to damage the layers of the metal gate. In an embodiment in which an annealing process is conducted, the temperature is kept in the range of 400 to 600 degrees Celsius. In a preferred embodiment, the annealing process is conducted using an $H_2/N_2$ mixture at 400 to 600° C. for a period of thirty minutes.

In a preferred embodiment, the next processing step after the deposition and optional annealing of the TiN layer 800 is the deposition of a second layer of metal 900 over the TiN layer. With the diffusion barrier layer 800 in place, a second layer of metal or metal compound can be selected from a variety of metals and metal compounds because the diffusion barrier layer 800 prevents reaction between the material of the first layer 700 and the material of the second layer 900. Preferably, the second layer 900 includes a metal or metal compound which is selected for ease of deposition process and conformal properties. Preferably, the second layer 900 includes tungsten.

Figure 9:
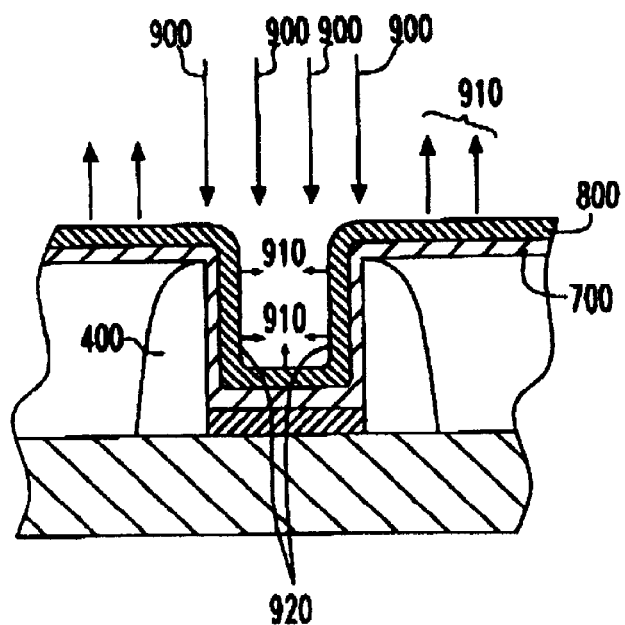

The process of depositing the second layer 900 is illustrated in FIG. 9 in which a layer of tungsten is deposited as the second layer 900. In an embodiment, the second layer 900 can be deposited using a CVD process that uses $WF_6$ as the deposition precursor or source gas. As illustrated in the example of FIG. 9, the deposition of $WF_6$ is in a downward direction as shown at 900. The direction of tungsten growth is indicated by 910 and is upwards and sideways in the opening 600 along the sidewalls 920 of the opening.

The deposition of the diffusion barrier layer 800 between the first layer 700 and second layer 900 of metal provides several advantages. For one, most diffusion barrier layers such as TiN provide good surface nucleation along the sidewalls 920, as shown in FIG. 9. Improved surface nucleation improves adhesion of tungsten, especially in instances where CVD process is performed using $WF_6$ as a precursor or a source gas. Improved surface nucleation and improved tungsten adhesion can help reduce peeling of tungsten, a problem often associated with the prior art methodology currently in practice.

In addition, TiN and other diffusion barrier layers have more conformal properties which avoid the problems caused by the non-conformal nature of a tungsten layer deposited from a $W(CO)_6$ precursor. This particularly addresses the problems of pinch-off and formation of a void in the middle of the gate that arises during deposition of tungsten from a $W(CO)_6$ precursor. This is due to the fact that the tungsten deposition from the $WF_6$ precursor fills the opening more conformally, from the sidewalls 920 of the opening rather than from other directions.

In addition TiN and other diffusion barrier layers are a barrier to fluorine penetration. Since a gas such as $WF_6$ is used for the deposition of the tungsten gate, and fluorine can damage the underlying silicon, the TiN layer and other diffusion barrier layers can reduce the chance of penetration through a gate oxide layer. This allows a very thin layer of tungsten (preferably between 2–20 nm) to be used initially which greatly reduces the processing cost.

Figure 10:
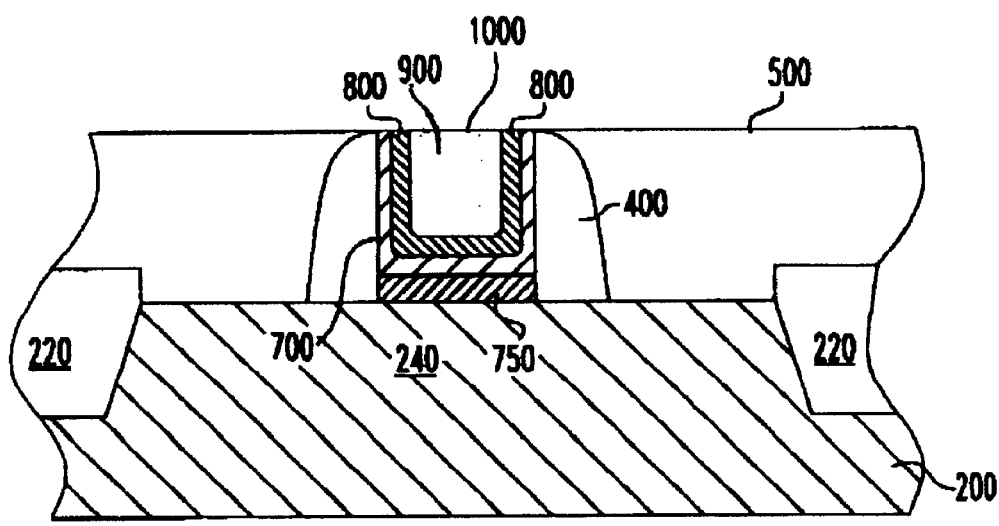

FIG. 10 is an illustration of the resultant metal gate 1000 formed in a preferred embodiment of the invention. As shown in FIG. 10, the resultant metal gate 1000 includes a first layer of metal or metal compound 700 in contact with the gate dielectric 750, a diffusion barrier layer 800 such as the preferred structure of titanium-TiN here and an overlying layer 900 of metal, such as tungsten. When the metal gate includes tungsten as the first and third layers 700, 900, it operates much like a gate formed entirely of tungsten but without some of the problems that plague the fabrication and performance of a gate formed entirely of tungsten. In a particular embodiment, at least one of the first layer 700 and the third layer 900 includes an impurity concentration which adjusts the metal gate 1000 to a desired to a workfunction.

The metal gate 1000 can be planarized using a chemical-mechanical polishing process and stopping on the dielectric layer 500. Gate contacts (not shown) can then be provided to the metal gate structure 1000 from above for interconnection to other elements of the chip. The metal gate formed according to the embodiment illustrated in FIG. 10 addresses problems associated with prior art metal gate processes such as structurally deficient gates, gates having voids and gates susceptible to peeling.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a gate structure of an integrated circuit, comprising:
    forming a metal-containing gate in an opening within a dielectric region formerly occupied by a sacrificial gate, said metal-containing gate including:
    a first layer deposited via a chemical vapor deposition (CVD) process using a carbonyl of a metal as a deposition precursor, the first layer contacting a gate dielectric, the gate dielectric contacting a transistor channel region in a semiconductor region of a substrate;
    a diffusion barrier layer overlying said first layer; and
    a second layer overlying said diffusion barrier layer, wherein said first layer is thinner than said second layer and said first layer is between 2 nm and 10 nm thick.

2. The method of claim 1 wherein said diffusion barrier layer is annealed before forming the second layer.

3. The method of claim 2 further comprising the step of annealing said diffusion barrier at a temperature ranging between 400 and 600 degrees Celsius.

4. The method of claim 3, wherein said second layer is deposited using a chemical vapor deposition (CVD) process.

5. The method of claim 4 wherein said second layer is deposited using a fluorine containing compound gas of a metal as a deposition precursor.

6. The method of claim 1 wherein second layer of metal is deposited from a fluorine containing precursor.

7. The method of claim 1 wherein said first layer consists essentially of at least one material selected from the group consisting of iridium (Ir), niobium (Nb), platinum (Pt), rhenium (Re), rhodium (Rh), ruthenium (Ru), tantalum (Ta), tantalum nitride (TaN), tantalum silicon nitride (TaSiN), tungsten (W), and vanadium (V).

8. The method of claim 1 wherein said second layer consists essentially of at least one material selected from the group consisting of iridium (Ir), niobium (Nb), platinum (Pt), rhenium (Re), rhodium (Rh), ruthenium (Ru), tantalum (Ta), tantalum nitride (TaN), tantalum silicon nitride (TaSiN), tungsten (W), vanadium (V), nickel (Ni) silicide, cobalt (Co) silicide and titanium (Ti) silicide.

9. The method of claim 1 wherein at least one of said first layer and said second layer includes an impurity concentration to adjust said metal gate to a desired workfunction.

10. The method of claim 1 further comprising depositing a layer of adhesion material prior to forming said diffusion barrier layer.

11. The method of claim 10 wherein said diffusion barrier layer consists essentially of titanium nitride (TiN) and said adhesion material consists essentially of titanium (Ti).

12. The method of claim 1 wherein said diffusion barrier layer includes at least one of a nitride of titanium, a nitride of hafnium and a nitride of zirconium.

13. The method of claim 12, wherein said diffusion barrier layer is formed by depositing TiN after depositing titanium.

14. The method of claim 12 wherein said diffusion barrier layer consists essentially of TiN.

15. The method of claim 1 wherein said dielectric region includes a pair of spacers disposed at sidewalls of said opening.

16. The method of claim 15 wherein said dielectric region includes an interlevel dielectric layer extending from sides of said spacers over said semiconductor region and said metal gate is planarized to a level of said interlevel dielectric layer.

17. The method of claim 16 wherein said metal gate is planarized by chemical mechanical polishing.

18. The method of claim 1 wherein said substrate is selected from the group consisting of a bulk semiconductor substrate, semiconductor-on-insulator substrate, silicon-on-insulator substrate, silicon germanium substrate and germanium substrate.

19. The method of claim 1 wherein said semiconductor region includes a thin film of semiconductor having a polycrystalline or amorphous form.

20. The method of claim 1 wherein said sacrificial gate is removed from the opening by etching and said method further comprises removing an etch stop layer disposed between the sacrificial gate and the semiconductor region and thereafter forming the gate dielectric.

21. The method of claim 20 wherein the gate dielectric has a different thickness than the etch stop layer.

22. The method of claim 21, wherein said etch stop layer consists essentially of a layer of oxide.

23. The method of claim 1, wherein said sacrificial gate consists essentially of polysilicon.

24. A method of fabricating a gate structure of an integrated circuit, comprising:

forming a metal-containing gate in an opening within a dielectric region formerly occupied by a sacrificial gate, said metal-containing gate including:

a first layer consisting essentially of tungsten deposited from a $W(CO)_6$ precursor, said first layer contacting a gate dielectric, the gate dielectric contacting a transistor channel region formed in a semiconductor region of a substrate;

a diffusion barrier layer overlying said first layer; and a second layer overlying said diffusion barrier layer, said second layer consisting essentially of tungsten deposited from a $WF_6$ precursor, at least one of said first layer and said second layer including an impurity concentration to adjust said metal gate to a desired workfunction.

25. A method of making a metal gate structure on a substrate comprising:

forming an etch stop layer on a semiconductor region of a substrate;

forming a sacrificial gate on said etch stop layer;

providing a pair of dielectric spacers on sidewalls of said sacrificial gate;

forming a dielectric layer on said substrate having a top surface generally planar to a top of said sacrificial gate;

removing said sacrificial gate to form an opening between said spacers;

removing said etch stop layer from under said opening;

forming a gate dielectric on said semiconductor region under said opening;

depositing from a $W(CO)_6$ a first layer consisting essentially of tungsten in said opening, said first layer contacting said gate dielectric and sidewalls of said spacers;

forming a diffusion barrier layer on said first layer in said opening; and depositing a from a $W(CO)_6$ a second layer consisting essentially of tungsten in said opening, said second layer contacting said diffusion barrier layer.

* * * * *